United States Patent
Gunji

(10) Patent No.: US 11,417,722 B2
(45) Date of Patent: Aug. 16, 2022

(54) DISPLAY DEVICE INCLUDING A LOW RESISTANCE CATHODE WIRING

(71) Applicant: Japan Display Inc., Minato-ku (JP)

(72) Inventor: Masakazu Gunji, Minato-ku (JP)

(73) Assignee: Japan Display Inc., Tokyo (JP)

( * ) Notice: Subject to any disclaimer, the term of this patent is extended or adjusted under 35 U.S.C. 154(b) by 44 days.

(21) Appl. No.: 16/983,083

(22) Filed: Aug. 3, 2020

(65) Prior Publication Data

US 2020/0365681 A1 Nov. 19, 2020

Related U.S. Application Data

(63) Continuation of application No. PCT/JP2019/003855, filed on Feb. 4, 2019.

(30) Foreign Application Priority Data

Feb. 6, 2018 (JP) .............................. JP2018-019076

(51) Int. Cl.
*H01L 29/08* (2006.01)
*H01L 27/32* (2006.01)

(52) U.S. Cl.
CPC ...... *H01L 27/3279* (2013.01); *H01L 27/3262* (2013.01)

(58) Field of Classification Search
CPC ........................ H01L 27/3279; H01L 27/3262
USPC ........................................................ 257/40
See application file for complete search history.

(56) References Cited

U.S. PATENT DOCUMENTS

| 2003/0146693 A1* | 8/2003 | Ishihara | H01L 27/3276 313/504 |
|---|---|---|---|
| 2004/0256620 A1 | 12/2004 | Yamazaki et al. | |
| 2014/0042424 A1* | 2/2014 | Yamakita | H01L 27/3272 257/40 |
| 2015/0340648 A1* | 11/2015 | Jang | H01L 51/5246 257/40 |
| 2016/0104759 A1* | 4/2016 | Oshima | H01L 27/3279 257/40 |
| 2016/0197099 A1 | 7/2016 | Sasaki | |

(Continued)

FOREIGN PATENT DOCUMENTS

| JP | 2003-303687 A | 10/2003 |
|---|---|---|
| JP | 2005-31651 A | 2/2005 |
| JP | 2005-340058 A | 12/2005 |

(Continued)

OTHER PUBLICATIONS

Japanese Office Action dated Jul. 20, 2021 in Patent Application No. 2018-019076, (submitting English translation only), 6 pages.

(Continued)

*Primary Examiner* — Phuc T Dang
(74) *Attorney, Agent, or Firm* — Maier & Maier, PLLC

(57) ABSTRACT

The display device includes a substrate, a first wiring provided on the substrate, an insulating layer having a first contact hole, and provided on the first wiring, a plurality of pixels arranged in a display region on the first insulating layer, each of the plurality of pixels having a transistor and a light emitting element, a common electrode provided in common to the plurality of light emitting elements and electrically connected to the first wiring via the first contact hole in a peripheral region surrounding the display region.

11 Claims, 12 Drawing Sheets

(56) References Cited

U.S. PATENT DOCUMENTS

2017/0343844 A1   11/2017  Aoki
2018/0006098 A1*  1/2018  Hong ................. H01L 27/3279

FOREIGN PATENT DOCUMENTS

| JP | 2011-222146 A | 11/2011 |
|---|---|---|
| JP | 2013-38229 A | 2/2013 |
| JP | 2016-127190 A | 7/2016 |
| JP | 2017-211484 A | 11/2017 |

OTHER PUBLICATIONS

International Search Report dated Mar. 26, 2019 in PCT/JP2019/003855 filed Feb. 4, 2019, 2 pages.
Office Action dated Nov. 2, 2021 in corresponding Japanese Patent Application No. 2018-019076 (English Translation only), 3 pages.

* cited by examiner

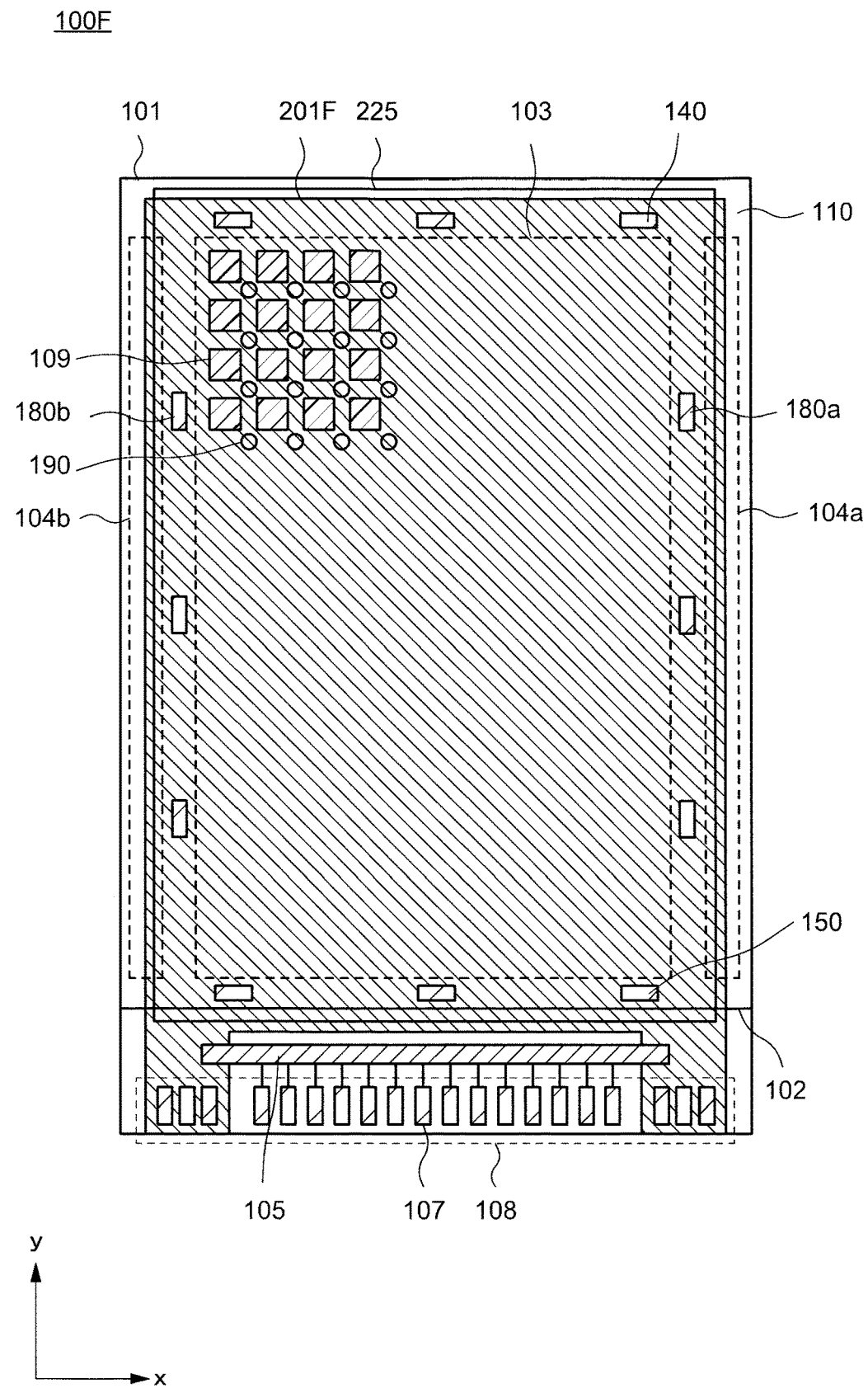

DISPLAY DEVICE INCLUDING A LOW RESISTANCE CATHODE WIRING

CROSS REFERENCE TO RELATED APPLICATIONS

This application is based upon and claims the benefit of priority from the prior Japanese Patent Application No. 2018-019076 filed on Feb. 6, 2018, and PCT Application No. PCT/JP2019/003855 filed on Feb. 4, 2019, the entire contents of which are incorporated herein by reference.

FIELD

One embodiment of the present invention relates to an organic EL (Electroluminescence) display device.

BACKGROUND

Recently, as a display device, an organic EL display device using an organic EL material for a light-emitting element of a display unit has been put into practical use. In such the organic EL display device, a transistor is formed on a substrate and a light-emitting element is formed on the transistor. The light-emitting element is a pixel electrode electrically connected to the transistor, an organic layer having a light-emitting layer, and a common electrode are formed in this order. The light-emitting element emits light by using one of the pixel electrode and the common electrode as an anode and the other as a cathode, and by passing a current between the anode and the cathode. In a top-emission type organic EL display device, the common electrode is formed of a single transparent conductive layer over the entire area of a display region, the light emitted in the light-emitting layer is emitted to the outside through the common electrode (Japanese laid-open patent publication No. 2011-222146).

SUMMARY

A display device according to an embodiment of the present invention includes a substrate, a first wiring provided on the substrate, an insulating layer having a first contact hole, and provided on the first wiring, a plurality of pixels arranged in a display region on the first insulating layer, each of the plurality of pixels having a transistor and a light emitting element, a common electrode provided in common to the plurality of light emitting elements and electrically connected to the first wiring via the first contact hole in a peripheral region surrounding the display region.

BRIEF DESCRIPTION OF DRAWINGS

FIG. 12 is a planar schematic view showing a structure of a display device according to an embodiment of the present invention.

DESCRIPTION OF EMBODIMENTS

Figure 1:
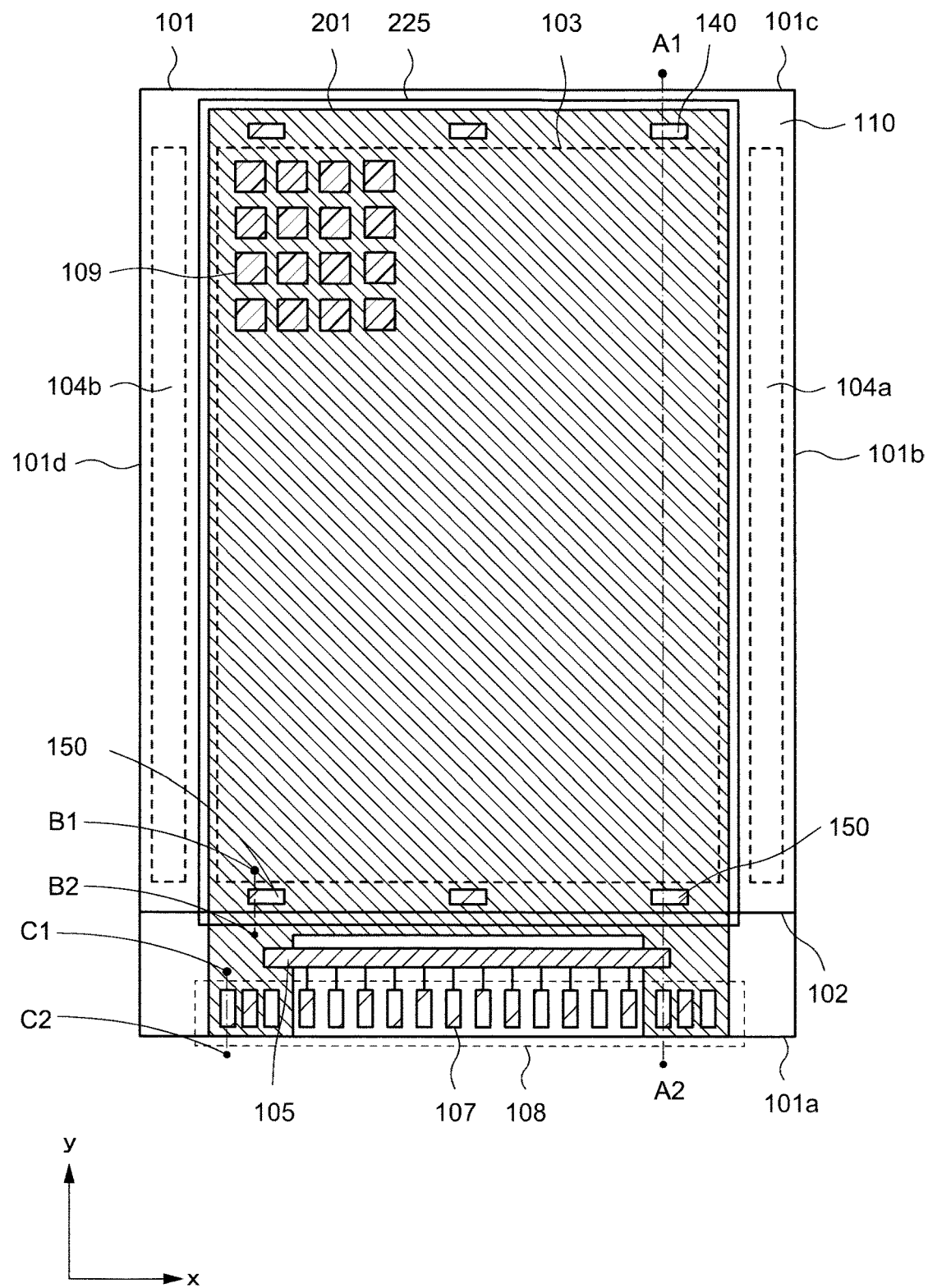
FIG. 1 is a planar schematic view showing a structure of a display device according to an embodiment of the present invention.

An organic EL display device is increasingly demanding higher brightness to improve visibility and contrast. To achieve this, an organic EL element must be supplied with a larger current. Therefore, it is preferable that the current feeding path to the organic EL element be as low as possible resistance.

In order to reduce the resistance of a cathode wiring, it is useful to increase the thickness or the width. However, providing a cathode wiring having a large thickness or width on a peripheral region of a display region prevents narrowing a frame of the display device. Since the cathode wiring length also increases with the expansion of the display region, the ratio of the cathode wiring in the peripheral region is further increased.

Therefore, one of object of the present invention is to provide a display device with a narrow frame.

Embodiments of the present invention will be described below with reference to the drawings and the like. However, the present invention can be carried out in various modes without departing from the gist thereof and should not be construed as being limited to the description of the following embodiments. With reference to the drawings, the width, thickness, shape, and the like of each portion may be schematically represented as compared with actual embodiments in order to make the description clearer, but the schematic drawings are only examples and are not intended to limit the interpretation of the present invention. In addition, in the present specification and each of the drawings, the same or similar elements as those described with reference to the preceding drawings are denoted by the same reference numerals, and a repetitive description thereof may be omitted.

In the present invention, when a single film is processed to form a plurality of films, these plural films may have different functions and roles. However, these plural films are derived from films formed as the same layer in the same process and have the same layer structure and the same material. Therefore, these plural films are defined as being present in the same layer.

In this specification, expressions such as "upper", "lower" and the like in describing the drawings indicate a relative positional relationship between a structure of interest and another structure. In this specification, in a side view, a direction from a first substrate to a pixel electrode, which will be described later, is defined as "up" and the opposite direction is defined as "down". In the present specification and claims, when expressing a mode of arranging another structure on a certain structure, it is intended to include both the case of arranging the other structure directly above the structure so as to be in contact with the certain structure and the case of arranging the other structure above the certain structure via the still another structure, unless otherwise specified.

First Embodiment

A display device 100 according to the present embodiment will be described referring to FIG. 1 to FIG. 5.

FIG. 1 is a planar schematic view showing a structure of the display device 100 according to an embodiment of the present invention. As shown in FIG. 1, the display device 100 has a display region 103 and a peripheral region 110 surrounding the display region 103.

The display region 103 has a plurality of pixels 109 arranged in a matrix. Each of the plurality of pixels has a light-emitting element.

The peripheral region 110 is provided with a terminal part 108 having a plurality of terminals 107, a driver IC 105, and driving circuits 104a and 104b. The peripheral region 110 refers to a region from the display region 103 to an end portion of the substrate 101 in a substrate 101. The substrate 101 includes a first side 101a along a first direction (in the x-direction in FIG. 1), a second side 101b along a second direction (in the y-direction in FIG. 1) that intersects the first direction, a third side 101c that opposes the first side 101a with the display region 103 interposed therebetween, and a fourth side 101d that opposes the second side 101b with the display region 103 interposed therebetween.

The terminal part 108 is provided between the first side 101a of the substrate 101 along the first direction and the display region 103, and the driver IC 105 is provided between the terminal part 108 and the display region 103. The driving circuit 104a is provided between the second side 101b along the second direction intersecting the first direction of the substrate 101 and the display region 103. The driving circuit 104b is provided between the fourth side 101d which is opposed to each other with the second side 101b of the substrate 101 with the display region 103 interposed therebetween and the display region 103.

The driving circuits 104a and 104b are connected to a scanning line connected to the pixel 109 and function as a scanning line driving circuit. The driver IC 105 is connected to a signal line connected to the pixel 109 and incorporates a signal line driving circuit. In FIG. 1, the driver IC 105 shows an example in which the signal line driving circuit is incorporated, but apart from the driver IC 105, the signal line driving circuit may be provided on the substrate 101.

The driver IC 105 may be arranged on the substrate 101 in a form of an IC chip. The driver IC 105 may be provided on a flexible printed circuit board, although not shown. The flexible printed circuit board is connected to the terminal part 108 provided on the substrate 101.

A video signal corresponding to image data is applied to each pixel 109 from the driver IC 105 via the signal line. Each pixel 109 is supplied with signals for selecting each pixel 109 through the driving circuits 104a, 104b, and a scanning line from the driver IC 105. With these signals, a transistor included in the pixel 109 can be driven to perform a screen display corresponding to the image data.

Figure 2:
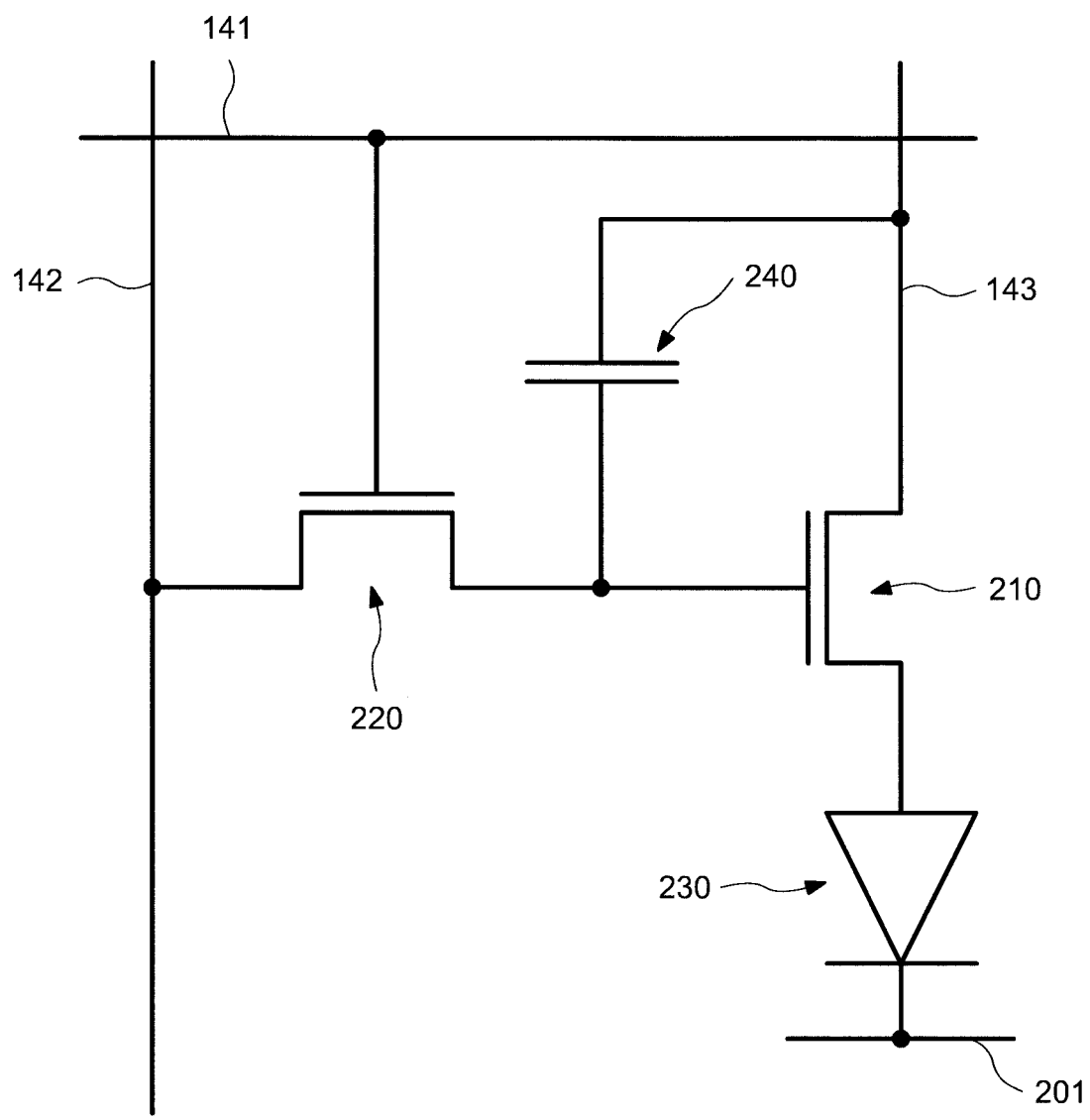
FIG. 2 is a diagram showing a pixel circuit of a display device according to an embodiment of the present invention.

FIG. 2 shows a pixel circuit of the pixel 109. The pixel 109 has at least a transistor 210, a transistor 220, a light-emitting element 230, and a storage capacitor 240.

The transistor 210 functions as a driving transistor. That is, the transistor 210 is connected to the light-emitting element 230 and is a transistor for controlling the luminance of the light-emitting element 230. The transistor 210 has a gate, a source, and a drain. The gate of the transistor 210 is connected to the transistor 220 with one of the source or the drain connected to a driving power supply line 143 and the other of the source or the drain connected to a pixel electrode of the light-emitting element 230. The drain current of the transistor 210 is controlled by the gate-source voltage.

The transistor 220 functions as a selecting transistor. That is, the transistor 220 controls the conduction status between the gate of a signal line 142 and the transistor 210. The transistor 220 includes a gate, a source, and a drain. The gate of the transistor 220 is connected to a scanning line 141, one of the source or the drain is connected to the signal line 142, and the other of the source or the drain is connected to the gate of the transistor 210.

One electrode of the storage capacitor 240 is connected to the gate of the transistor 210 and the other to the driving power supply line 143. Since the driving power supply line 143 is supplied with a constant potential, the gate potential of the transistor 210 is held for a certain period by the storage capacitor 240. If the storage capacitor 240 is provided between the gate and the source of the driving transistor 210, the gate-source voltage of the driving transistor 210 is held for a certain period by the storage capacitor 240.

The light-emitting element 230 includes a pixel electrode electrically connected to the transistor 210, an organic layer on the pixel electrode, and a common electrode on the organic layer. Specifically, pixel electrode of the light-emitting element 230 is connected to the source, the other of the drain of the transistor 210, the common electrode is connected to a cathode wiring 201.

The pixel electrode of the light-emitting element 230 is provided on each of the pixels 109. A transparent conductive layer is provided continuously over the entire area of the display region 103 of the common electrode. Material such as, for example, indium tin oxide is used as the transparent conductive layer. The transparent conductive layer has a higher resistance than metals such as aluminum. Therefore, to uniformly flow a current to a single transparent conductive layer over the entire area of the display region, it is preferable to make voltage drop hardly occurs in the plane. A large current also flows through the cathode wiring for supplying current to the common electrode. Therefore, it must be formed so that resistance of the cathode wiring is sufficiently low.

In order to reduce the resistance of the cathode wiring, it is useful to increase the thickness or width. However, providing a cathode wiring having a large thickness or width on a peripheral region of a display region prevents narrowing a frame of the display device. Since the cathode wiring length with the expansion of the display region is also longer, when increasing the display device, the ratio of area occupied by the cathode wiring in the peripheral region is further increased.

The cathode wiring is typically arranged from a few micrometers to tens of micrometers wide. If the width of the cathode wiring is small, wiring resistance increases. Therefore, when a large current flows through the cathode wiring, the calorific value increases.

The cathode wiring is usually arranged on the same layer as a wiring connecting the driver IC and the display region or a wiring connecting the driver IC and the driving circuit. Therefore, in a region between the driver IC and the display region, wiring construction becomes complicated and area becomes large. In particular, this issue becomes more pronounced when wiring count increases with high definition.

Therefore, in one embodiment of the present invention, the cathode wiring electrically connected to the common electrode is arranged in a layer lower than the layer on which the transistor is formed. Then, the common electrode is electrically connected to the cathode wiring 201 via a contact hole of an undercoat layer 202.

Figure 3:
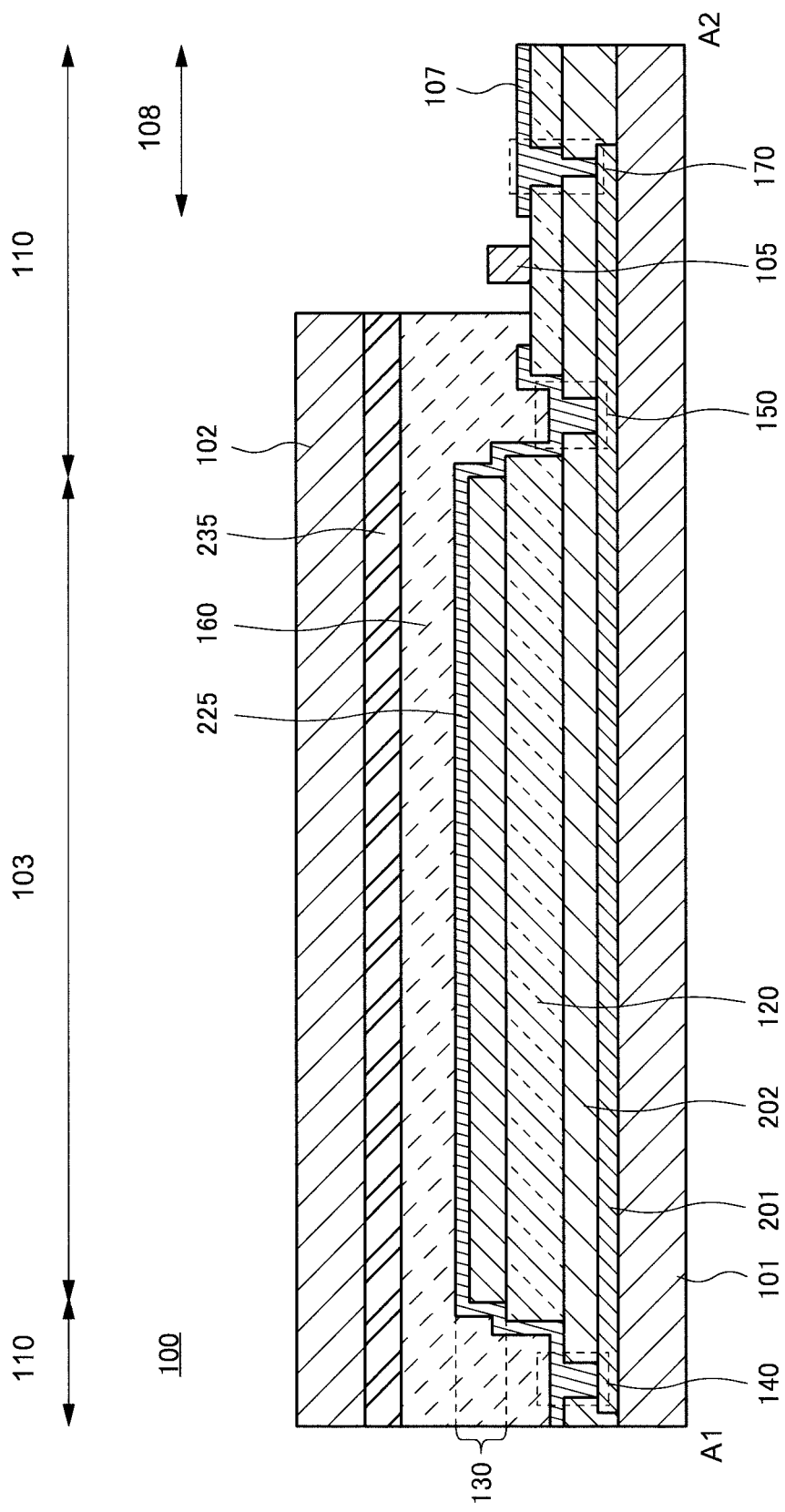
FIG. 3 is a cross-sectional schematic view showing a structure of a display device according to an embodiment of the present invention.

FIG. 3 shows a cross-sectional schematic view of the display device 100 taken along the A1-A2 line shown in FIG. 1.

As shown in FIG. 3, the cathode wiring 201 is arranged on the substrate 101. As the substrate 101, a glass substrate, a quartz substrate, a flexible substrate (polyimide, polyethylene terephthalate, polyethylene naphthalate, triacetyl cellulose, a cyclic olefin-copolymer, a cycloolefin polymer, and a resin substrate having flexibility thereof) can be used. A substrate 102 can be formed of the same materials as the substrate 101. In the present embodiment, examples of configuring the display device 100 using a substrate having flexibility as the substrate 101 and the substrate 102 will be described. The substrate having flexibility can be used as the substrate 101 and the substrate 102 to bend the display device 100.

The cathode wiring 201 can be formed of a single layer or a stacked layer of metallic materials such as copper, molybdenum, tantalum, tungsten, aluminum, and titanium. By forming the cathode wiring 201 by stacking titanium, aluminum, and titanium, it is possible to realize a low resistance and an improvement in connectivity with wirings of other layers. The cathode wiring 201 is arranged so as to overlap with the display region 103 as shown in FIG. 1.

The undercoat layer 202 is arranged on the cathode wiring 201. The undercoat layer 202 is an insulating layer formed of inorganic materials such as silicon oxide, silicon nitride, and aluminum oxide. The undercoat layer 202 is not limited to a single layer, and may have, for example, a stacked structure in which a silicon oxide layer and a silicon nitride layer are combined. The undercoat layer 202 is provided to prevent an impurity from entering an element forming layer 120 from the substrate 101.

The element forming layer 120 is provided on the undercoat layer 202. A plurality of transistors constituting the pixel 109 and the driving circuits 104a and 104b is formed in the element forming layer 120. The transistor can typically be a thin film transistor. Both an N-channel type transistor and a P-channel type transistor can be used for the transistor.

A light emitting element forming layer 130 is provided on the element forming layer 120. A plurality of light-emitting elements constituting the pixel 109 is formed in the light emitting element forming layer. In the substrate 101, a region provided with the light emitting element forming layer 130 corresponds to the display region 103. The top layer of the light emitting element forming layer 130 is provided with a common electrode 225. The common electrode 225 is commonly provided for a plurality of pixels. In other words, the common electrode 225 is formed of a continuous transparent conductive layer over the entire area of the display region 103.

Then, the common electrode 225, in the peripheral region 110, is electrically connected to the cathode wiring 201 provided in a layer lower than the element forming layer 120. As shown in FIG. 1, the common electrode 225 is electrically connected between the driver IC 105 and the display region 103 to the cathode wiring 201 via the contact hole provided in the undercoat layer 202. Between the first side 101a and the display region 103 of the substrate 101 and the third side 101c and the display region 103, the common electrode 225 is electrically connected to the cathode wiring 201 through contact holes provided in the undercoat layer 202. In this specification and the like, a region in which the common electrode 225 and the cathode wiring 201 are electrically connected is referred to as a cathode contact.

In FIG. 1 and FIG. 3, between the driver IC 105 and the display region 103, the region in which the common electrode 225 is electrically connected to the cathode wiring 201 is shown as a cathode contact 150. Between the third side 101c and the display region 103, the region in which the common electrode 225 is electrically connected to the cathode wiring 201 is shown as a cathode contact 140.

The cathode wiring 201 is electrically connected to at least one of the plurality of terminals 107 included in the terminal part 108. A region where the cathode wiring 201 electrically connected to the terminal 107 is shown as a contact 170.

By arranging the cathode wiring 201 below the element forming layer 120, the width of the cathode wiring 201 can be increased without being constrained by area of the peripheral region 110. Thus, it is possible to reduce the resistance of the cathode wiring 201. Since there is no need to arrange a cathode wiring having a large width and thickness in the peripheral region 110, it is possible to reduce the area of the peripheral region 110. In other words, it is possible to narrow the frame of the display device 100.

By arranging the cathode wiring 201 lower layers than the element forming layer 120, it is possible to increase the width and thickness of the cathode wiring 201. Thus, it is possible to reduce the resistance of the cathode wiring 201. Therefore, it is possible to reduce the calorific value due to a large current flow through the cathode wiring 201.

By providing the cathode wiring 201 lower layers than the element forming layer 120, the cathode wiring 201 can be arranged in further lower layers than the wiring connecting the driver IC 105 and the display region 103, and the wiring connecting the driver IC 105 and the driving circuits 104a, 104b. That is, the cathode wiring 201 can overlap the wiring connecting the driver IC 105 and the display region 103 and the wiring connecting the driver IC 105 and the driving circuits 104a, 104b. Thus, it is also possible to provide the cathode wiring 201 having a large width and thickness in the region between the driver IC 105 and the display region 103. Therefore, it is possible to simplify and narrow the frame of the wiring structure of the region between the driver IC 105 and the display region 103. In particular, it is useful when the number of wiring increases with high definition. The driving circuit 104b is provided between the fourth side 101d which is opposed to each other with the second side 101b of the substrate 101 with the display region 103 interposed therebetween and the display region 103.

As shown in FIG. 3, a sealing layer 160 is provided on the common electrode 225. The sealing layer 160 is provided to prevent moisture from entering the light emitting element forming layer 130. The sealing layer 160 may be formed using an inorganic insulating layer and an organic insulating layer. The substrate 102 is provided on the sealing layer 160 via an adhesive material 235.

Figure 4:
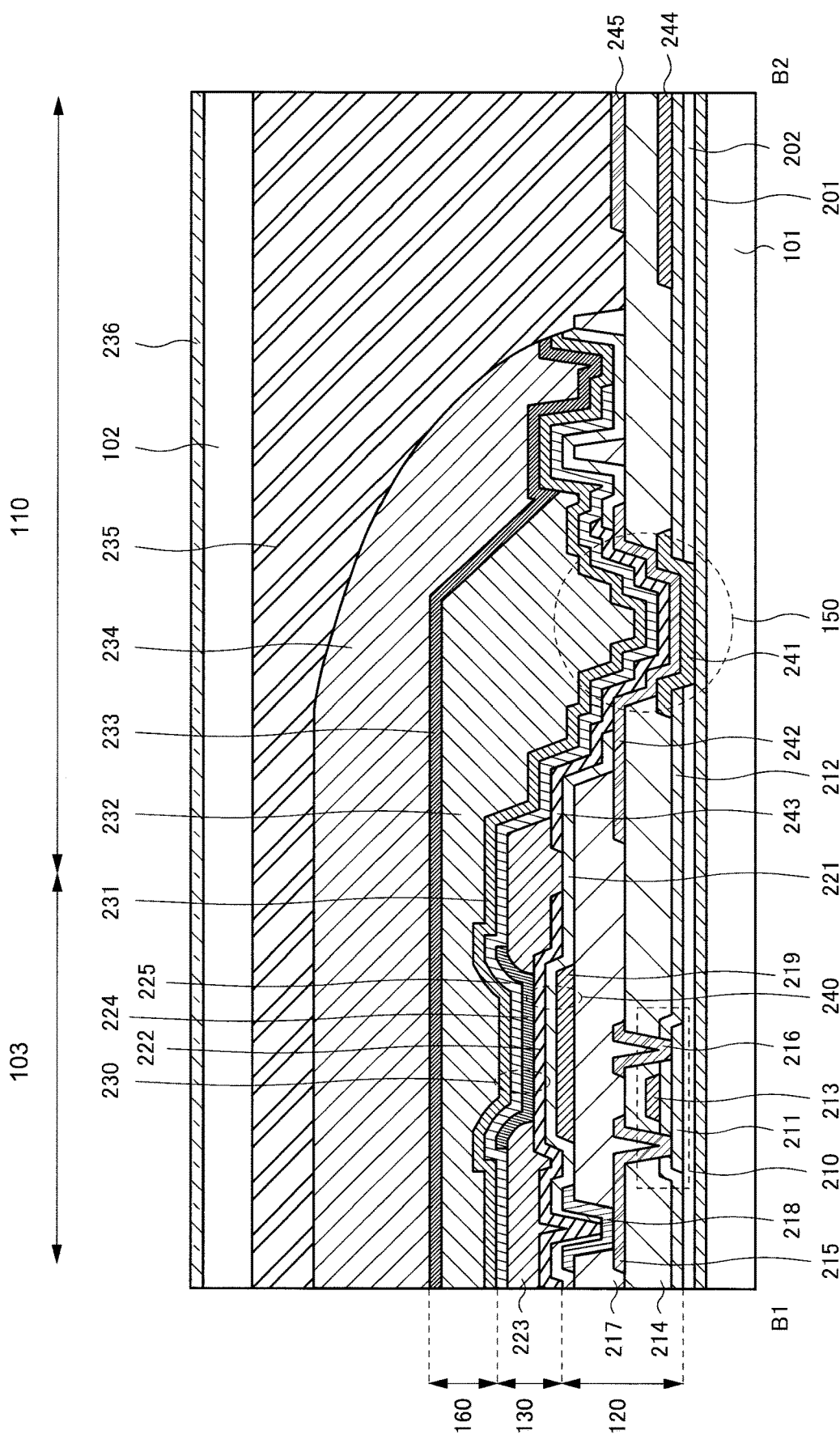
FIG. 4 is a cross-sectional view showing a structure of a display device according to an embodiment of the present invention.

Next, structures of the element forming layer 120, the light emitting element forming layer 130, and the cathode contact 150 will be described in more detail referring to FIG. 4. FIG. 4 is a cross-sectional view taken along B1-B2 line shown in FIG. 1.

First, a structure of the element forming layer 120 in which the plurality of transistors is provided, and a structure of the light emitting element forming layer 130 in which a plurality of light-emitting elements 230 is provided will be described.

As shown in FIG. 4, the cathode wiring 201 is arranged on the substrate 101. The undercoat layer 202 is provided on the cathode wiring 201.

The transistor 210 is provided on the undercoat layer 202. The structure of the transistor 210 may be a top-gate type or a bottom-gate type. In FIG. 4, the transistor 210 is the top-gate type. The transistor 210 includes a semiconductor layer 211 provided on the undercoat layer 202, a gate insulating layer 212 covering the semiconductor layer 211, a gate electrode 213 provided on the gate insulating layer 212. An interlayer insulating layer 214 which covers the gate electrode 213 is provided over the transistor 210. A source electrode or a drain electrode 215 and a source electrode or a drain electrode 216 are provided over the interlayer insulating layer 214. The source electrodes or the drain electrodes 215 and 216 are connected to the semiconductor layer, respectively. In the present embodiment, an example that the interlayer insulating layer 214 is a single-layer structure, but the interlayer insulating layer 214 may be a stacked structure.

Materials of each layer constituting the transistor 210 may be any known materials and are not particularly limited. For example, polysilicon, amorphous silicon, or oxide semiconductor can generally be used as the semiconductor layer 211. As the gate insulating layer 212, silicon oxide or silicon nitride can be used. The gate electrode 213 is formed of metallic materials such as copper, molybdenum, tantalum, tungsten, and aluminum. As the interlayer insulating layer 214, silicon oxide or silicon nitride can be used. Each of the source electrode or the drain electrode 215, the source electrode or the drain electrode 216 is formed of a metallic material such as copper, titanium, molybdenum, aluminum, or the like.

Although not shown in FIG. 4, the same layer as the gate electrode 213, it is possible to provide the scanning line 141 formed of the same film as the gate electrode 213. Although not shown in FIG. 4, the signal line 142 extending in a direction intersecting the scanning line 141 can be arranged on the same layers as the source electrode or the drain electrode 215 and the source electrode or the drain electrode 216.

A planarizing layer 217 is provided on the transistor 210. The planarizing layer 217 includes an organic resin material. As the organic resin material, a known organic resin material such as polyimide, polyamide, acrylic, or epoxy can be used. These materials are characterized in that film formation is possible by a solution coating method and a flattening effect is high. Although not shown in particular, the planarizing layer 217 is not limited to a single layer structure and may have a stacked structure of layers containing an organic resin material and an inorganic insulating layer.

The planarizing layer 217 includes a contact hole that exposes a portion of the source electrode or the drain electrode 215. The contact hole is an opening for electrically connecting a pixel electrode 222 described later and the source electrode or the drain electrode 215. Therefore, the contact hole is provided overlap with a part of the source electrode or the drain electrode 215. The source electrode or the drain electrode 215 is exposed at a bottom surface of the contact hole.

The contact hole provided in the planarizing layer 217, a transparent conductive layer 218 is provided. The transparent conductive layer 218 overlaps with the contact hole included in the planarizing layer 217 and electrically connects to the source electrode or the drain electrode 215 exposed at the bottom surface of the contact hole. As the transparent conductive layer 218, an indium-oxide transparent conductive layer (e.g., ITO) or a zinc-oxide transparent conductive layer (e.g., IZO, ZnO) can be used.

A conductive layer 219 is provided on the planarizing layer 217. The conductive layer 219 may be formed using materials similar to the source electrode or the drain electrode 215 and the source electrode or the drain electrode 216. The conductive layer 219 is used for forming a routing wiring in the peripheral region 110 and forming a capacity element which is additionally provided in the pixel 109. By providing the transparent conductive layer 218 on the source electrode or the drain electrode 215, it is possible to protect from a patterning when forming the conductive layer 219. On the other hand, the conductive layer 219 may be formed simultaneously using the same conductive material as the transparent conductive layer 218.

An inorganic insulating layer 221 is provided on the transparent conductive layer 218. A silicon nitride film or the like is preferably used as the inorganic insulating layer 221. In the inorganic insulating layer 221, the contact hole is formed in a region where the source electrode or the drain electrode 215 and the transparent conductive layer 218 overlaps with each other.

In this specification and the like, a layer in which the semiconductor layer 211 to the inorganic insulating layer 221 are formed is referred to as the element forming layer 120. Since the element forming layer 120 only needs to be at least transistor is formed, other layers may be omitted as appropriate.

The pixel electrode 222 is provided on the inorganic insulating layer 221. The pixel electrode 222 is connected to the transparent conductive layer 218 via the contact hole provided in the inorganic insulating layer 221. Thus, the pixel electrode 222 is electrically connected to the source electrode or the drain electrode 215. In the display device 100 of the present embodiment, the pixel electrode 222 functions as a pixel electrode (anode) constituting the light-emitting element 230. The pixel electrode 222 has a different structure depending on whether the light-emitting element 230 is of a top-emission type or a bottom-emission type. For example, if the light-emitting element 230 is of the top-emission type, a highly reflective metal film, or a stacked structure of a metal film and a transparent conductive layer having a high work function such as the indium-oxide transparent conductive layer (e.g., ITO), the zinc-oxide transparent conductive layer (e.g., IZO, ZnO) is used. Conversely, if the light-emitting element 230 is of the bottom emission type, the transparent conductive layer described above is used as the pixel electrode 222. In the present embodiment, a top-emission type organic EL display device will be exemplified. The conductive layer 219, the inorganic insulating layer 221, and the pixel electrode 222 can constitute an additional capacitor.

In the present embodiment, the structure in which the transparent conductive layer 218 is provided on the planarizing layer 217 has been described, but the present invention is not limited to this structure. Without providing the transparent conductive layer 218, in the contact hole provided in the planarizing layer 217, the source electrode or the drain electrode 215 may be directly connected to the pixel electrode 222. The conductive layer 219 and the inorganic insulating layer 221 may be omitted.

An insulating layer 223 formed of an organic resin material is provided on the pixel electrode 222. As the organic resin material, a known resin material such as a polyimide type, a polyamide type, an acrylic type, an epoxy type or a siloxane type can be used. The insulating layer 223 has an opening in a part on the pixel electrode 222. The insulating layer 223 is provided between the pixel electrode 222 adjacent to each other so as to cover an end portion (edge portion) of the pixel electrode 222, and functions as a member that isolates the adjacent pixel electrode 222. For this reason, the insulating layer 223 is also commonly referred to as "barrier" and "bank". A part of the pixel electrode 222 exposed from the insulating layer 223 becomes a light-emitting region of the light-emitting element 230. Preferably, the opening of the insulating layer 223 has a tapered shape inner wall. As a result, poor coverage of the end portion of the pixel electrode 222 can be reduced when forming an organic layer 224, which will be described later. The insulating layer 223 not only covers the end portion of the pixel electrode 222 but may also function as a filler to fill a concave part due to the contact hole included in the planarizing layer 217.

The organic layer 224 is provided on the pixel electrode 222. The organic layer 224 includes a light-emitting layer formed of at least an organic material and functions as a light-emitting portion of the light-emitting element 230. In addition to the light-emitting layer, the organic layer 224 may also include various charge transport layers, such as a positive hole injection layer and/or a positive hole transport layer, an electron injection layer, and/or an electron transport layer. The organic layer 224 is provided to cover the light-emitting region, that is, to cover the opening of the insulating layer 223 in the light-emitting region.

In the present embodiment, the organic layer 224 including a light-emitting layer that emits light of a desired color is provided, and the organic layer 224 including a different light-emitting layer is formed on each pixel electrodes 222 to display each color of R, G, and B. That is, in the present embodiment, the light-emitting layer of the organic layer 224 is discontinuity between the adjacent pixel electrode 222. Although not shown, the positive hole injection layer and/or the positive hole transport layer, the electron injection layer, and/or the electron transport layer may be continuously provided between the adjacent pixel electrodes 222. As the organic layer 224, a known structure or a known material can be used and is not particularly limited to the structure of the present embodiment. The organic layer 224 includes a light-emitting layer in which emits white light and may display R, G, and B colors through a color filter. The organic layer 224 may also be provided on the insulating layer 223.

The common electrode 225 is provided on the organic layer 224 and the insulating layer 223. The common electrode 225 functions as a common electrode (cathode) constituting the light-emitting element 230. Since the display device 100 of the present embodiment is of the top-emission type, a transparent electrode is used as the common electrode 225. As a thin film constituting the transparent electrode, an MgAg thin film or the transparent conductive layer (ITO or IZO) is used. In the present embodiment, the light-emitting element 230 is composed of a part of the pixel electrode 222 (anode) exposed from the insulating layer 223, the organic layer 224 (light-emitting portion), and the common electrode 225 (cathode).

In this specification and the like, the layers from the pixel electrode 222 to the common electrode 225 are referred to as the light emitting element forming layer 130.

The common electrode 225 is commonly provided to the plurality of light-emitting elements 230. In other words, the common electrode 225 is formed of a continuous transparent conductive layer over the entire area of the display region 103. Then, the common electrode 225 is electrically connected to the cathode wiring 201 arranged in a layer lower than the element forming layer 120 in the peripheral region 110.

Next, a structure of the cathode contact 150 in which the common electrode 225 and the cathode wiring 201 are connected is described.

At the cathode contact 150, the common electrode 225 is electrically connected to the cathode wiring 201 via the contact hole included in the undercoat layer 202. The common electrode 225 is electrically connected to the cathode wiring 201 via a plurality of conductive layers. The common electrode 225, for example, as shown in FIG. 4, is connected to the cathode wiring 201 via a conductive layer 241, a conductive layer 242, and a transparent conductive layer 243. The conductive layer 241 is formed of the same film as the gate electrode 213, and the conductive layer 242 is formed of the same film as the source electrode or the drain electrode 215, 215. The transparent conductive layer 243 is formed of the same film as the pixel electrode 222.

As shown in FIG. 4, an example shows that the common electrode 225 is connected to cathode wiring 201 via the conductive layer 241, the conductive layer 242, and the transparent conductive layer 243, but the present invention is not limited thereto. A conductive layer may be further provided between the common electrode 225 and the cathode wiring 201, or any of the conductive layer 241, the conductive layer 242, and the transparent conductive layer 243 may be omitted. By providing a plurality of conductive layers between the common electrode 225 and the cathode wiring 201, since the unevenness of the common electrode 225 is reduced, it is possible to improve the step coverage of the common electrode 225.

Although the structure of the cathode contact 150 has been described in FIG. 4, the cathode contact 140 shown in FIG. 1 also has the same structure as the cathode contact 150.

The sealing layer 160 is provided so as to cover the light-emitting element 230 and the cathode contact 150. The sealing layer 160 is formed by combining an inorganic insulating layer and an organic insulating layer. FIG. 4 shows a structure in which an inorganic insulating layer 231, an organic insulating layer 232, and an inorganic insulating layer 233 are sequentially stacked as the sealing layer.

A resin layer 234 is provided on the sealing layer 160. The resin layer 234 contains a resin such as an epoxy resin or an acrylic resin. The resin layer 234 is formed by coating an oligomer serving as a raw material by a wet film forming method, a vapor deposition method, or a spraying method, and then polymerizing the oligomer. The resin layer 234 functions as a mask for patterning the inorganic insulating layer 221, the inorganic insulating layer 231, and the inorganic insulating layer 233. The interlayer insulating layer 214 and a wiring 245 are exposed by removing the inorganic insulating layer 221, the inorganic insulating layer 231, and the inorganic insulating layer 233 using the resin layer 234 as the mask.

The adhesive material 235 is provided on the resin layer 234. For example, an acrylic, rubber-based, silicone-based, or urethane-based adhesive material can be used for the adhesive material 235. The adhesive material 235 may contain a water absorbing material such as calcium or zeolite. By including the water absorbing material in the adhesive material 235, it is possible to delay moisture from reaching the light-emitting element 230 even when moisture enters the inside of the display device 100. The adhesive material 235 may be provided with a spacer to ensure a gap between the substrate 101 and the substrate 102. Such a spacer may be mixed into the adhesive material 235 or may be formed on the substrate 101 by a resin or the like.

The substrate 102 may be provided with, for example, an overcoat layer for planarization. If an organic layer 227 emits white light, the substrate 102 may be provided with a color filter corresponding to each color of the RGB to the main surface (a surface facing the substrate 101) and a black matrix provided between the adjacent color filter. When the color filter is not formed on the substrate 102, for example, the color filter may be formed directly on the sealing layer 160, and the adhesive material 235 may be formed on the color filter.

Back surface (display surface side) of the substrate 102 is provided with a polarizing plate 236. The polarizing plate 236 is, for example, a circularly polarizing plate. The substrate 102 may be omitted, and the circularly polarizing plate may be attached to an array substrate via the adhesive material. In other words, the substrate 102 may be the circularly polarizing plate.

In the peripheral region 110, a wiring 244 is arranged on the gate insulating layer 212 and the wiring 245 is arranged on the interlayer insulating layer 214. The wiring 244 and the wiring 245 are electrically connected to the driver IC 105 shown in FIG. 1. Since the peripheral region 110 shown in FIG. 4 is in the vicinity of the display region 103 and the driver IC 105, many wirings are mixed. In the present embodiment, since the cathode wiring 201 is arranged in a layer lower than the element forming layer 120, it is possible to simplify and narrow the frame of a wiring structure in the vicinity of the display region 103 and the driver IC 105.

Figure 5:
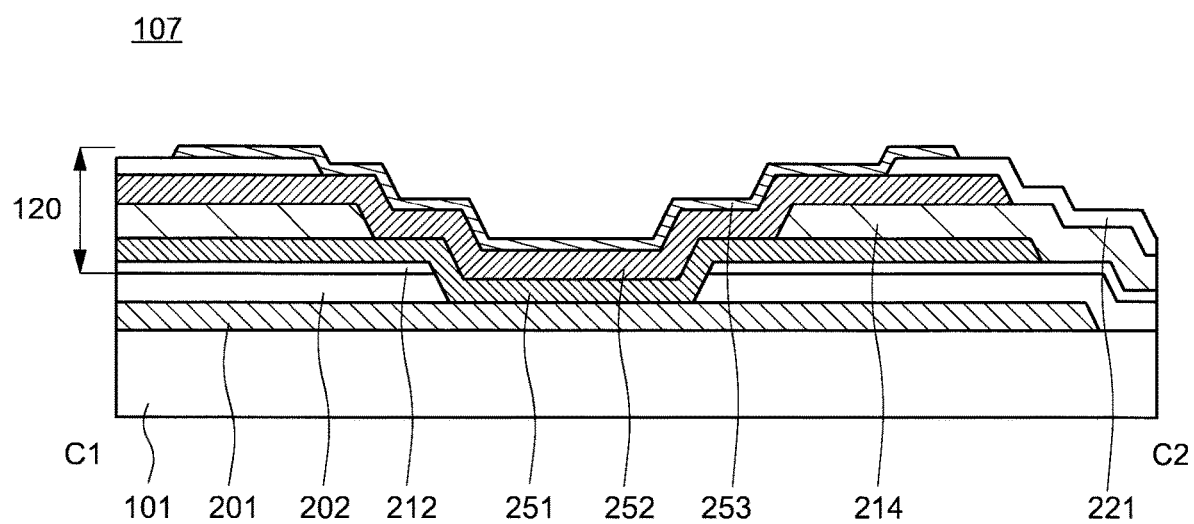
FIG. 5 is a cross-sectional view showing a structure of a display device according to an embodiment of the present invention.

Next, the structure of the terminal 107 shown in FIG. 1 will be described in more detail with reference to FIG. 5 and FIG. 6. FIG. 5 is a cross-sectional view of the terminal 107 shown in FIG. 1 taken along C1-C2 line.

As shown in FIG. 5, the cathode wiring 201 is arranged on the substrate 101. The undercoat layer 202 and the gate insulating layer 212 are provided on the cathode wiring 201. The undercoat layer 202 and the gate insulating layer 212 are provided with openings. A conductive layer 251 is provided on the gate insulating layer 212. The conductive layer 251 is formed of the same film as the gate electrode 213 shown in FIG. 4. The conductive layer 251 is connected to the cathode wiring 201 via the openings provided in the undercoat layer 202 and the gate insulating layer 212.

The interlayer insulating layer 214 is provided on the conductive layer 251, the interlayer insulating layer 214 is provided with an opening. A conductive layer 252 is provided on the interlayer insulating layer 214. The conductive layer 252 is formed of the same film as the source electrode or the drain electrode. The conductive layer 252 is connected to the conductive layer 251 via the opening provided in the interlayer insulating layer 214.

The inorganic insulating layer 221 is provided on the conductive layer 252. The inorganic insulating layer 221 is provided with an opening. A transparent conductive layer 253 is provided on the inorganic insulating layer 221. The transparent conductive layer 253 is formed of the same film as the common electrode 225. The transparent conductive layer 253 is connected to the conductive layer 252 via the opening provided in the inorganic insulating layer 221.

Although not shown, the transparent conductive layer 253 is electrically connected to the flexible printed circuit board via an anisotropic conductive film. That is, the flexible printed circuit board is electrically connected to the cathode wiring 201.

The cathode wiring is typically arranged on the same layer as the scanning line or the signal line. Therefore, a region between the driver IC and the terminal part is provided with the scanning line or the signal line and the cathode wiring. Therefore, in the region between the driver IC and the terminal part, the wiring structure becomes complicated and the area becomes large. In particular, it becomes more remarkable when the number of wiring increases with high definition.

According to the structure of the terminal 107 shown in FIG. 5, the cathode wiring 201 is connected to the transparent conductive layer 253 in a region overlapped with the transparent conductive layer 253. In the region where the transparent conductive layer 253 is provided, a region electrically connected to the flexible printed circuit board and a region electrically connected to the cathode wiring 201 are overlapping.

By arranging the cathode wiring 201 below the element forming layer 120, the cathode wiring 201 can be arranged in a layer further lower than the scanning line and the signal line. Therefore, a large-width cathode wiring 201 can also be arranged in the region between the driver IC 105 and the terminal part 108. Thus, it is possible to simplify and narrow the frame of wiring structure of the region between the driver IC 105 and the terminal part 108. In particular, it is useful when the number of wiring increases with high definition.

A region where the transparent conductive layer 253 is electrically connected to the flexible printed circuit board may not necessarily overlap with the region where the conductive layer 251 and the cathode wiring 201 is connected. In the vicinity of the transparent conductive layer 253, the conductive layer 251 and the cathode wiring 201 may be connected.

Second Embodiment

In the present embodiment, a terminal 107A having a structure partially different from that of the terminal 107 shown in FIG. 5 will be described referring to FIG. 6. Different from the terminal 107 shown in FIG. 5 is that the conductive layer 251 is not provided.

Figure 6:
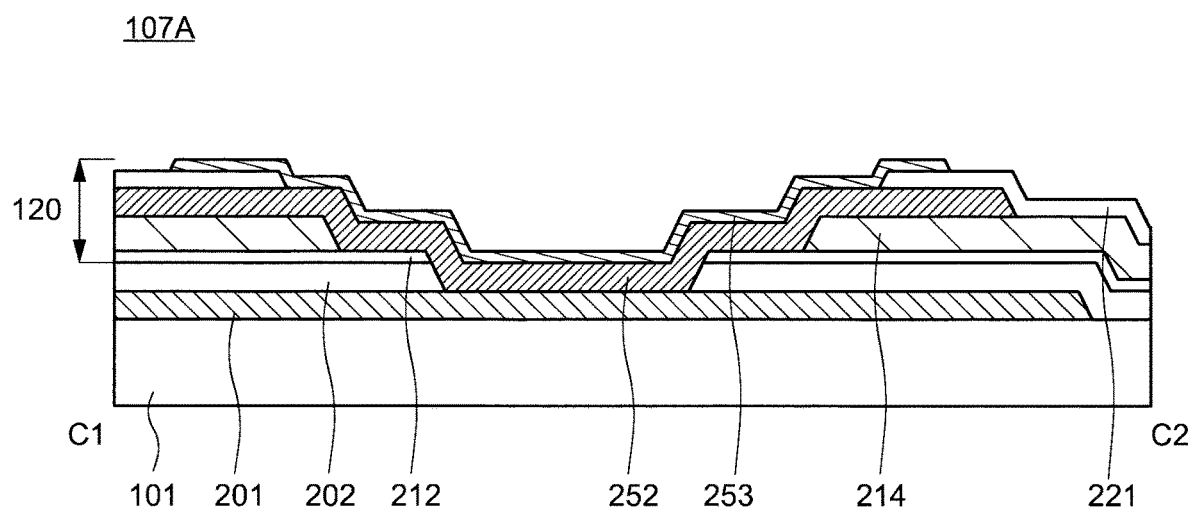
FIG. 6 is a cross-sectional view showing a structure of a display device according to an embodiment of the present invention.

The cathode wiring 201 shown in FIG. 6 is connected to the conductive layer 252 via the openings provided on the undercoat layer 202, the gate insulating layer 212, and the interlayer insulating layer 214. On the conductive layer 252, the inorganic insulating layer 221 is provided and connected to the conductive layer 252 via the opening provided in the inorganic insulating layer 221. When a material that does not corrode the surface of the cathode wiring 201 by etching is selected while the conductive layer 251 is patterned, the structure of FIG. 6 can be adopted.

The flexible printed circuit board and the cathode wiring 201 can be electrically connected also by the structure of the terminal 107A shown in FIG. 6. Thus, by arranging the cathode wiring 201 below the element forming layer 120, the cathode wiring 201 can be arranged in a layer further lower than the scanning line and the signal line. Therefore, the large-width cathode wiring 201 can also be arranged in the region between the driver IC 105 and the terminal part 108. Thus, it is possible to simplify and narrow the frame of wiring structure of the region between the driver IC 105 and the terminal part 108. In particular, it is useful when the number of wiring increases with high definition.

Third Embodiment

In the present embodiment, a display device having a structure partly different from that of the display device shown in FIG. 3 will be described referring to FIG. 7.

Figure 7:
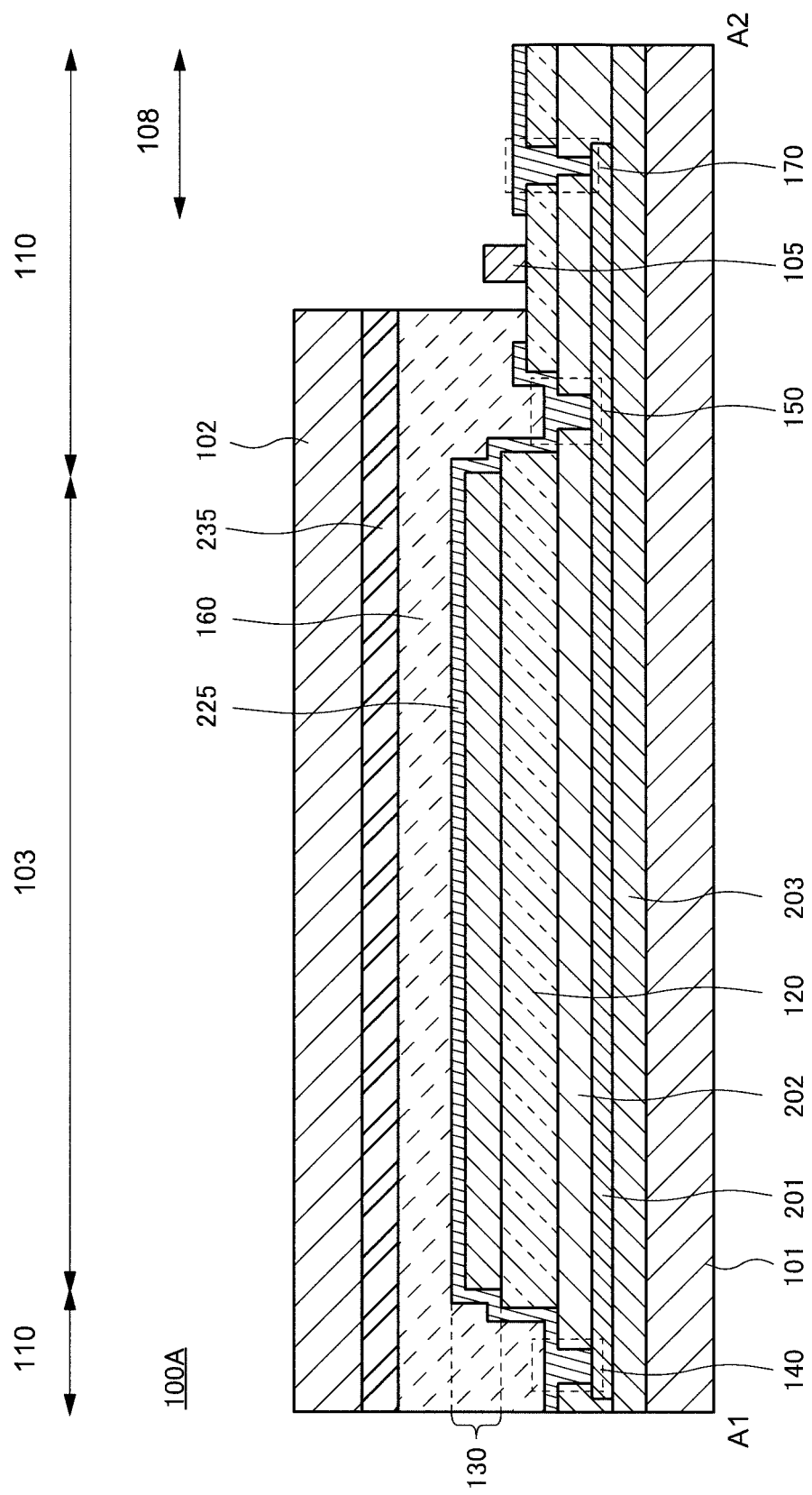
FIG. 7 is a cross-sectional schematic view showing a structure of a display device according to an embodiment of the present invention.

In a display device 100A shown in FIG. 7, an undercoat layer 203 is further provided between the substrate 101 and the cathode wiring 201. As the undercoat layer 203, silicon oxide and silicon nitride can be used. By providing the undercoat layer 203 between the substrate 101 and the cathode wiring 201, impurities can be suppressed from entering the element forming layer 120 from the substrate 101.

Although not shown, another resin layer may be further provided between the cathode wiring 201 and the undercoat layer 202. As another resin layer, for example, the material exemplified as the substrate 101 can be used.

Fourth Embodiment

Figure 8:
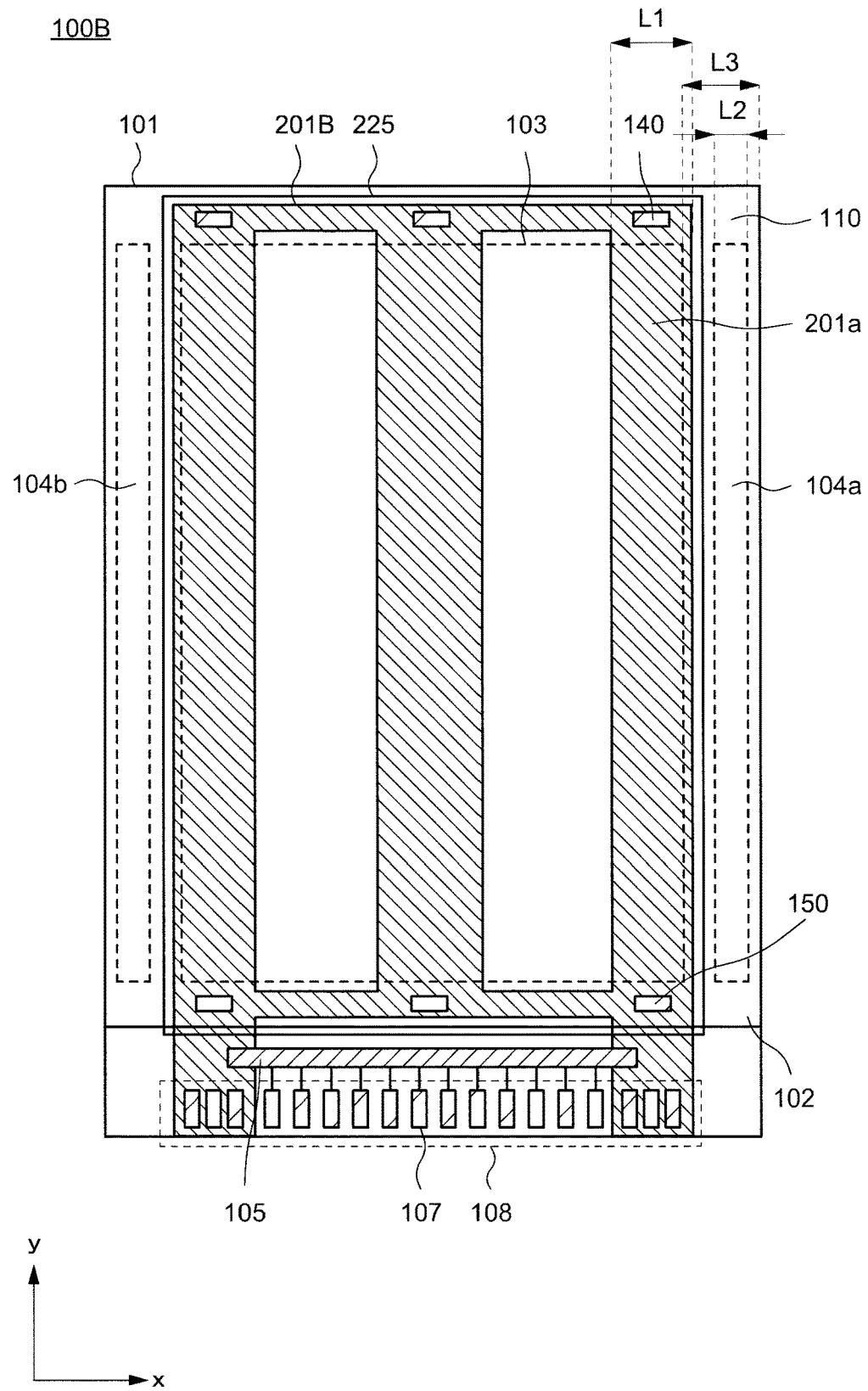
FIG. 8 is a planar schematic view showing a structure of a display device according to an embodiment of the present invention.

In this embodiment, the structure of the cathode wiring 201 will be described referring to FIG. 8. FIG. 8 is a planar schematic view of a display device 100B.

In the display device 100 shown in FIG. 1, an example that the cathode wiring 201 is arranged in a flat plate shape overlapping the display region 103 is shown, but the present invention is not limited thereto. As shown in FIG. 8, a cathode wiring 201B may overlap at least a part of the display region 103.

As shown in FIG. 8, the cathode wiring 201B has a structure that a plurality of wirings 201a is arranged along the second direction. That is, the cathode wiring 201B is arranged in a stripe shape to overlap the display region 103. A width L1 of the wiring 201a, for example, may be larger than a width L2 of the driving circuit 104a or may be larger than a width L3 of the peripheral region 110. Since the cathode wiring 201 is arranged in a layer lower than the element forming layer 120, the width L1 of the wiring 201a can be increased. The width L1 of the wiring 201a may be at least larger than the width of the signal line 142 connected to the transistor 220. The number of the wiring 201a is not particularly limited and may be two or four or more. The width L1 of each of the plurality of wirings 201a may be smaller than the width L2 of the driving circuit 104a. In this case, the total width L1 of the plurality of wirings 201a may be preferably greater than the width L2 of the driving circuit 104a or greater than the width L3 of the peripheral region 110.

According to the structure shown in FIG. 8, since a slit is provided parallel to the second direction (y-direction in FIG. 1), it is possible to prevent the cathode wiring 201B from being cracked when bending the display device 100B in the direction in which the first direction (x-direction in FIG. 8) is an arc.

The positions where the plurality of wirings 201a of the cathode wiring 201 is provided are also exemplified as being provided at both ends and the center of the display region 103, but the present invention is not limited thereto. The widths of the plurality of wirings 201a may not all be the same. However, it is preferable that the plurality of wirings 201a be provided to be symmetrical for each other so as not to cause variations in the amounts of currents applied to the common electrode 225.

Fifth Embodiment

Figure 9:
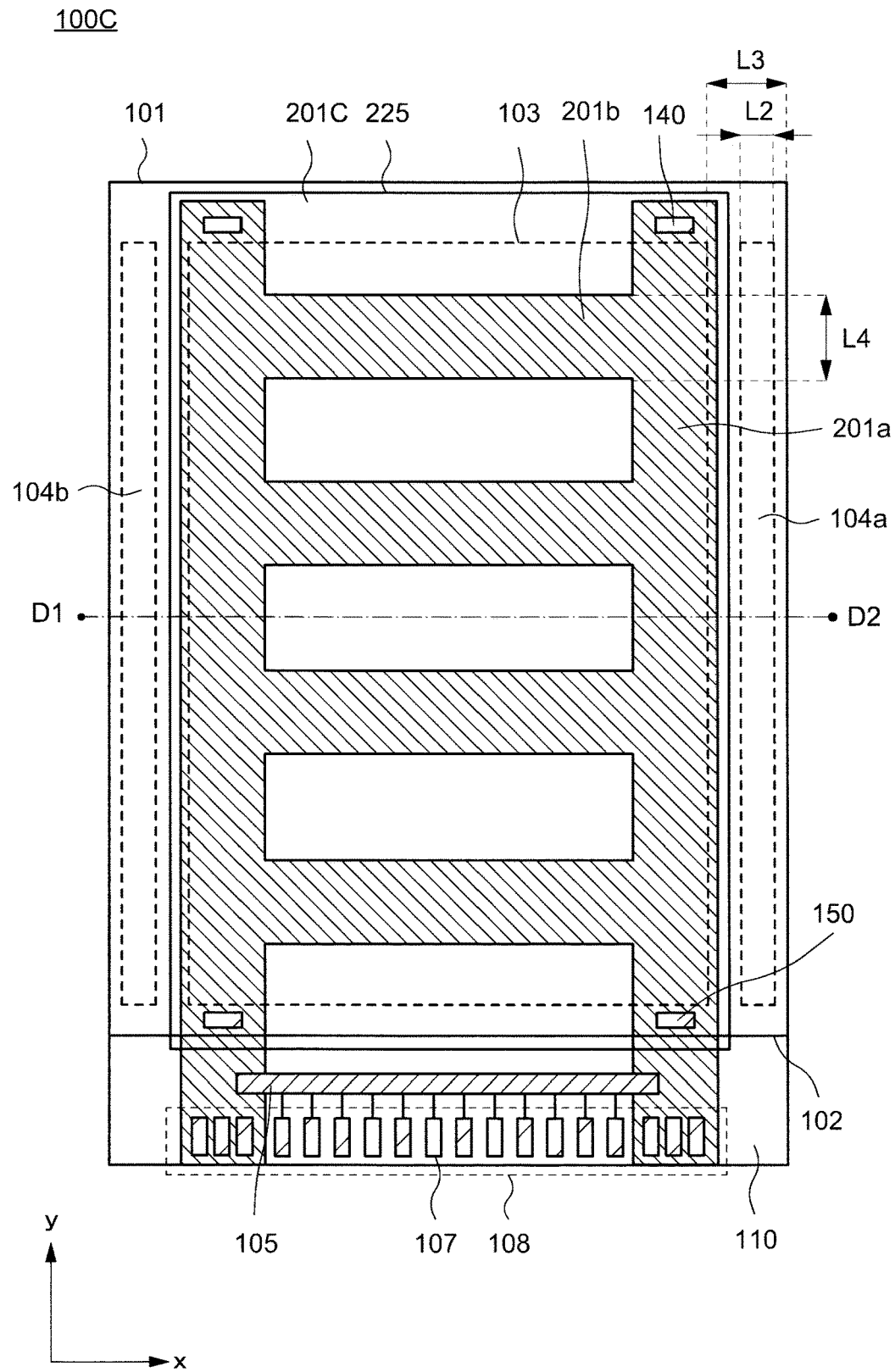
FIG. 9 is a planar schematic view showing a structure of a display device according to an embodiment of the present invention.

In this embodiment, a structure of a cathode wiring 201C will be described referring to FIG. 9. FIG. 9 is a planar schematic view of a display device 100C.

As shown in FIG. 9, the cathode wiring 201C has a shape in which a plurality of wirings 202b is arranged along the first direction (x-direction in FIG. 9). That is, the cathode wiring 201C is arranged in a stripe shape to overlap the display region 103. A width L4 of a wiring 201b, for example, may be larger than the width L2 of the driving circuit 104a or may be larger than the width L3 of the peripheral region 110. Since the cathode wiring 201C is arranging in a layer lower than the element forming layer 120, the width L1 of the wiring 201a and the width L4 of the wiring 201b can be increased. The width L4 of the wiring 201b may be at least greater than the width of the scanning line 141 connected to the transistor 220. The number of the wiring 201a is not particularly limited and may be two or four or more. The width L4 of each of a plurality of wirings 201b may be smaller than the width L2 of the driving circuit 104a. In this case, the total width of the width L1 of the plurality of wirings 201b preferably may be larger than the width L2 of the driving circuit 104a and larger than the width L3 of the peripheral region 103. When the display device 100C is bent along the first direction, it is preferable to bent along D1-D2 line in which the wiring 201b is not arranged.

According to the structure shown in FIG. 9, since the slit is provided parallel to the first direction, it is possible to prevent the cathode wiring 201C from being cracked when bending the display device 100C in the direction in which the second direction is an arc.

The positions where the plurality of wirings 201b of the cathode wiring 201C is arranged are also exemplified as being provided above and below the display region 103, but the present invention is not limited thereto. However, so as not to cause variations in the amount of current applied to the common electrode 225, the plurality of wiring 201b is preferably provided to be vertically symmetrical.

By arranging the cathode wiring 201C below the element forming layer 120, the width of the cathode wiring 201C can be increased without being limited by area of the peripheral region 110. As a result, resistance of the cathode wiring 201C can be reduced. Since there is no need to arrange the cathode wiring having a large width and thickness in the peripheral region 110, it is possible to reduce the area of the peripheral region 110. That is, the frame of the display device 100C can be narrowed.

Sixth Embodiment

Figure 10:
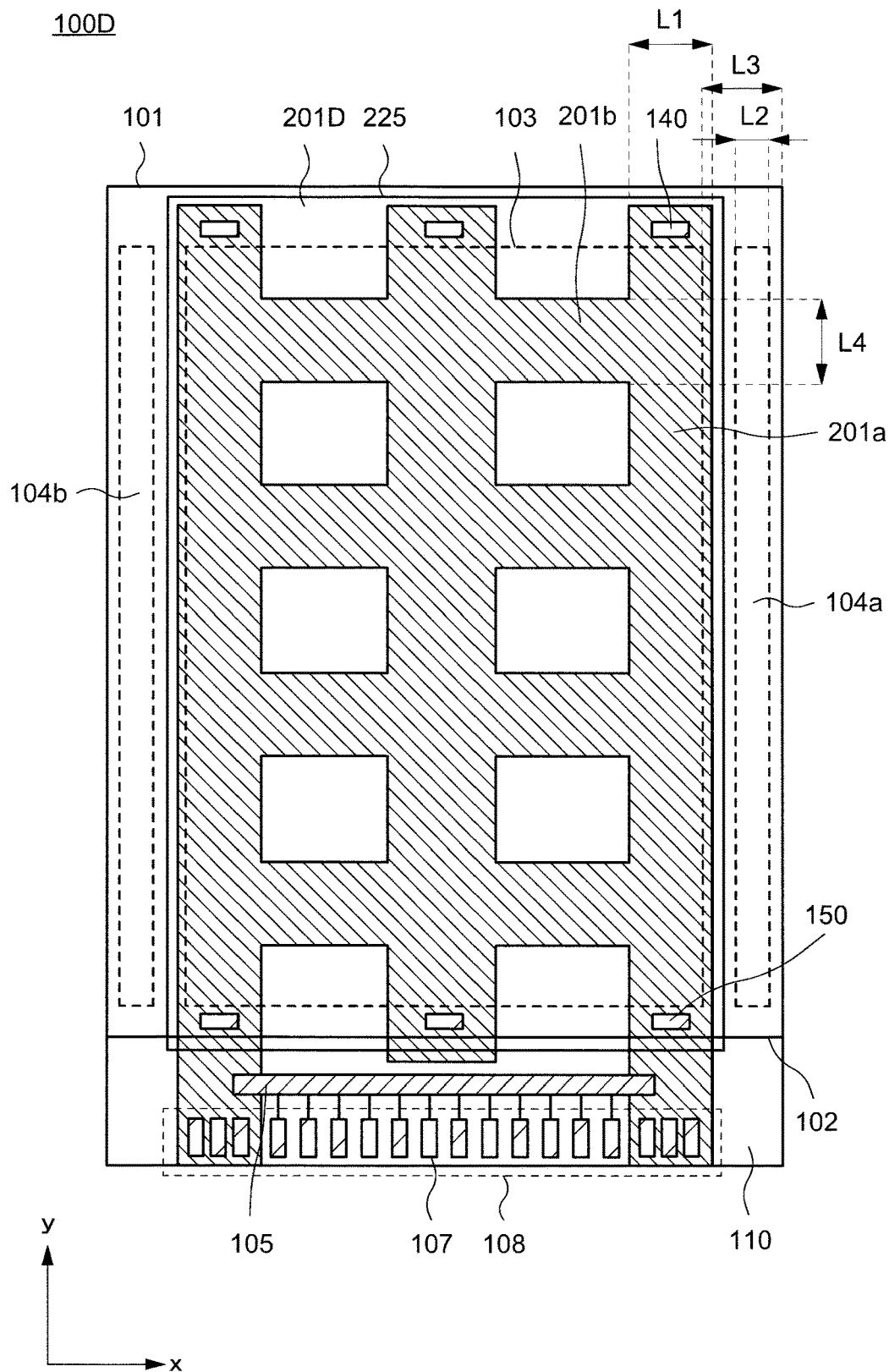
FIG. 10 is a planar schematic view showing a structure of a display device according to an embodiment of the present invention.

In this embodiment, a structure of a cathode wiring 201D will be described referring to FIG. 10. FIG. 10 is a planar schematic view of a display device 100D.

As shown in FIG. 10, the cathode wiring 201 has a lattice-like shape in which the plurality of wirings 201a is arranged along the second direction (y-direction in FIG. 10) and the plurality of wirings 202b is arranged along the first direction (x-direction in FIG. 10). That is, the cathode wiring 201D is arranged in a grid shape so as to overlap the display region 103. The width L1 of the wiring 201a and the width L4 of the wiring 201b are as described in FIG. 8 and FIG. 9.

According to the structure shown in FIG. 10, cracks can be suppressed from occurring the cathode wiring 201D when the display device 100D is bent in either the direction in which first direction becomes an arc or the direction in which the second direction becomes an arc.

By arranging the cathode wiring 201D below the element forming layer 120, the width of the cathode wiring 201D can be increased without being limited by the area of the peripheral region 110. As a result, resistance of the cathode wiring 201D can be reduced. Since there is no need to provide a cathode wiring having a large width and thickness in the peripheral region 110, it is possible to reduce the area of the peripheral region 110. That is, the frame of the display device 100D can be narrowed.

Seventh Embodiment

Figure 11:
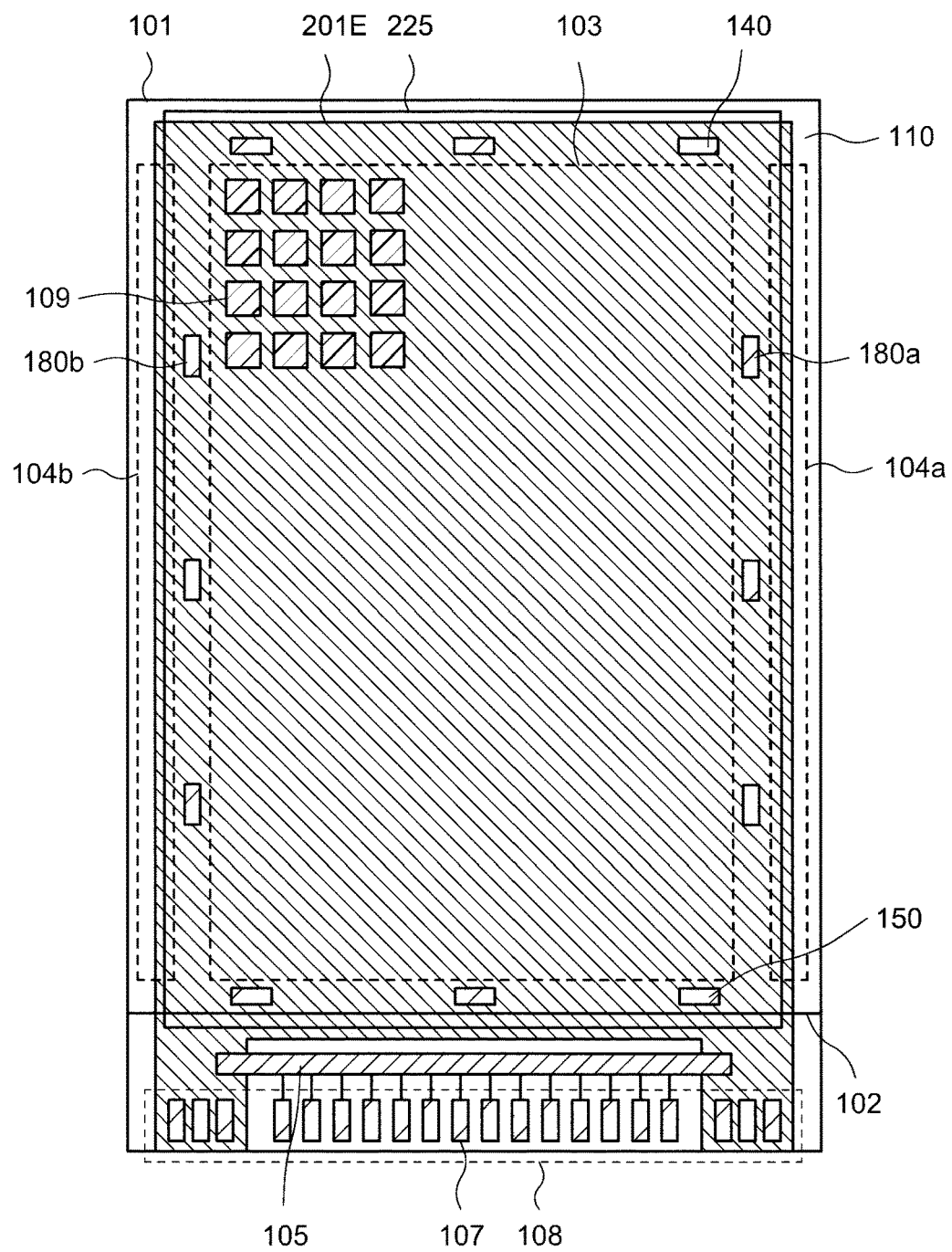
FIG. 11 is a planar schematic view showing a structure of a display device according to an embodiment of the present invention.

In this embodiment, a structure of a cathode wiring 201E will be described referring to FIG. 11. FIG. 11 is a planar schematic view of a display device 100E.

As shown in FIG. 11, the cathode wiring 201E may overlap not only the display region 103 but also a part of the driving circuits 104a, 104b. As shown in FIG. 11, the common electrode 225 may overlap the driving circuits 104a, 104b.

The undercoat layer 202 has contact holes between the display region 103 and the driving circuit 104a and between the display region 103 and the driving circuit 104b. Therefore, as shown in FIG. 11, the common electrode 225 is electrically connected to the cathode wiring 201 via the contact hole between the display region 103 and the driving circuit 104a. The common electrode 225 is electrically connected to the cathode wiring 201 via a contact hole between the display region 103 and the driving circuit 104b.

A region where the common electrode 225 is electrically connected to the cathode wiring 201 between the display region 103 and the driving circuit 104a is shown as a cathode contact 180a. Between the display region 103 and the driving circuit 104b, a region in which the common electrode 225 is electrically connected to the cathode wiring 201 is shown as a cathode contact 180b. The structure of the cathode contacts 180a and 180b can be referred to the description of FIG. 4.

As shown in FIG. 11, since the cathode wiring 201E is arranged in a layer lower than the element forming layer 120, the cathode wiring 201E can be arranged in various shapes. By arranging the cathode wiring 201E below the element forming layer 120, the width of the cathode wiring 201E can be increased without being limited by the area of the peripheral region 110. As a result, resistance of the cathode wiring 201E can be reduced. Since there is no need to arrange a cathode wiring having a large width and thickness in the peripheral region 110, it is possible to reduce the area of the peripheral region 110. That is, the frame of the display device 100E can be narrowed. The thickness of the display device 100E can be reduced.

Eighth Embodiment

In this embodiment, a structure of a cathode wiring 201F will be described referring to FIG. 12. FIG. 12 is a planar schematic view of a display device 100F.

As shown in FIG. 12, a plurality of cathode contacts 190 for connecting the cathode wiring 201F and the common electrode 225 may be formed in the display region 103. As described above, when the common electrode 225 is formed of a transparent conductive material, since the transparent conductive material has a high resistance, when the cathode wiring 201F is connected to the peripheral region 110 alone, the distance from the connection part to the vicinity of the center of the screen is large, and a voltage drop occurs. Therefore, by providing the cathode contact 190 also in the display region 103, the common electrode 225 and the cathode wiring 201F are directly connected in the vicinity of the center of the picture, so that the voltage drop in the display region 103 can be further suppressed. The cathode contacts 190 are provided, for example, by opening the insulating layer 223, the inorganic insulating layer 221, the planarization layer 217, the interlayer insulating layer 214, the gate insulating layer 212, and the undercoat layer 202 between the adjacent light-emitting region.

When the openings for forming the cathode contact 190 are provided, the organic layer 224 is preferably formed using masks so as not to overlap the openings for forming the cathode contact 190.

Although not shown in particular, cathode contacts for connecting the cathode wiring 201 and the common electrode 225 may be provided in the display region 103 in the display devices 100, 100A to 100E. Since the common electrode 225 and the cathode wiring 201 are directly connected in the display region 103, the voltage drops in the display region 103 can be further suppressed.

It is also within the scope of the present invention that a person skilled in the art adds, deletes, or changes designs of components, or adds, omits, or changes conditions of steps as appropriate based on the display device described as an embodiment and an embodiment of the present invention as long as the gist of the present invention is provided. Each of the embodiments described above can be combined with each other within a range that does not cause technical inconsistencies.

Even if it is other working effects which differ from the working effect brought about by the mode of the embodiment mentioned above, what is clear from the description of this specification, or what can be easily predicted by the person skilled in the art is naturally understood to be brought about by the present invention.

What is claimed is:

1. A display device comprising:
   a substrate;
   a first wiring provided on the substrate;
   a first insulating layer having a first contact hole, and provided on the first wiring;
   a plurality of pixels arranged in a display region on the first insulating layer, each of the plurality of pixels having a transistor and a light emitting element;
   a common electrode provided in common to the plurality of light emitting elements and electrically connected to the first wiring via the first contact hole in a peripheral region surrounding the display region, wherein
   the first wiring overlaps the entire display region.

2. The display device according to claim 1, further comprising:
   a terminal part having a plurality of terminals and a driver IC on the substrate,
   wherein the terminal part is provided between a first side of the substrate along a first direction and the display region, and the driver IC is provided between the terminal part and the display region, and the common electrode is provided between the driver IC and the display region and is connected to the first wiring via the first contact hole.

3. The display device according to claim 2, further comprising:
   a drive circuit provided between a second side along a second direction intersecting the first direction of the substrate and the display region;
   a second wiring electrically connecting the drive circuit to the driver IC; and
   a third wiring electrically connecting the pixel to the driver IC,
   wherein the first wiring overlaps on the second wiring and the third wiring.

4. The display device according to claim 3, further comprising a second contact hole provided in the first insulating layer between the display region and a third side facing the first side of the substrate across the display region,
   wherein the common electrode is electrically connected to the first wiring via the second contact hole.

5. The display device according to claim 2, wherein the first wiring overlaps at least a part of the driver IC.

6. The display device according to claim 3, wherein the first wiring includes a plurality of fourth wirings overlapping the display region and extending along the first direction, and a plurality of fifth wirings extending along the second direction.

7. The display device according to claim 3, wherein the first wiring overlaps at least a part of the driving circuit.

8. The display device according to claim 2, wherein the first wiring is electrically connected to at least one of the plurality of terminals.

9. The display device according to claim 2, wherein the first wiring has a plurality of fourth wirings that overlap with the display region and extend along the first direction.

10. The display device according to claim 1, further comprising a second insulating layer provided between the substrate and the first wiring.

11. The display device according to claim 1, wherein the first wiring overlaps at least a part of the display region.

* * * * *